United States Patent [19]

Yoshida

[11] Patent Number: 4,538,923
[45] Date of Patent: Sep. 3, 1985

[54] TEST CIRCUIT FOR WATCH LSI

[75] Inventor: Yosuke Yoshida, Tokyo, Japan

[73] Assignee: Kabushiki Kaisha Daini Seikosha, Tokyo, Japan

[21] Appl. No.: 421,916

[22] Filed: Sep. 23, 1982

[30] Foreign Application Priority Data

Sep. 24, 1981 [JP] Japan .................................. 56-151162

[51] Int. Cl.³ ....................... G04C 17/00; G04C 19/00
[52] U.S. Cl. .......................................... 368/70; 368/87
[58] Field of Search ....................... 368/69, 70, 85–87, 368/155–156, 82–84

[56] References Cited

U.S. PATENT DOCUMENTS

| | | | |
|---|---|---|---|
| 4,063,409 | 12/1977 | Bayliss | 368/84 |
| 4,150,537 | 4/1979 | Mochizuki et al. | 368/156 |
| 4,386,423 | 5/1983 | Sasaki et al. | 368/156 |

*Primary Examiner*—Vit W. Miska
*Attorney, Agent, or Firm*—Robert E. Burns; Emmanuel J. Lobato; Bruce L. Adams

[57] ABSTRACT

A test circuit for watch IC capable of setting an operating mode with the operations of a plurality of switches has a ROM for deciding next operating mode in response to the outputs of said switching circuit including the switches and the outputs of flipflops for holding a present operating mode.

A signal from a test terminal sets an initial state and provides the predetermined data instead of the outputs of flipflops to the ROM whereby an operator can set an arbitrary operating mode readily in a short time.

14 Claims, 5 Drawing Figures

4,538,923

TEST CIRCUIT FOR WATCH LSI

BACKGROUND OF THE INVENTION

The present invention relates to a test circuit for a LSI for use in a digital electronic watch.

Conventionally, a control circuit in a digital electronic watch is made up of flipflop circuits for holding the present mode and a ROM for determining the next mode by the present mode and a set of switch inputs. FIG. 1 shows an embodiment of a conventional switch input portion of a digital watch, and FIG. 2 shows an embodiment of a conventional mode determining portion of a digital watch.

In FIG. 1, numerals 1-4 are switch output terminals connected to Vss via pull-down resistors 5-8 and also to D inputs of flipflops 9-12. The flipflops 9-12 are provided to prevent the misoperation caused by chattering of the switch. A switch output is sampled by the falling edge of an SP signal in the figure. Outputs AA-DD from the flipflops 9-12 are fed to a control ROM 13 in FIG. 2. The control ROM 13 decides N×0-N×3 which indicate the next mode from the AA-DD and the signals MOD 0-MOD 3 produced from flipflops 14-17. Here the present mode is represented by the MOD 0-MOD 3 signals which carry out various controls. The MOD 0-MOD 3 signals change at the falling edge of the clock signal in the figure. Although the complicated controls are carried out comparatively easily by this circuit system, the mode can not be changed unless the combination of the switch inputs are changed. Thus it takes a considerably long time to set an arbitrary mode because a plurality of switches have to be operated in consideration of the present mode. This results in a serious problem in the LSI testing which should preferably be executed in an extremely short time.

SUMMARY OF THE INVENTION

The present invention aims to eliminate the above-noted drawback, and therefore it is an object of the invention to enable a mode to be set freely by use of a switch input, and in which a single test terminal is added to the test circuit and set at "H" during testing of the LSI.

It is another object of the invention to provide a test circuit for a timepiece IC capable of setting the desired operating mode of the timepiece with the operation of a switch comprising a switching circuit including said switch for changing the present operating mode of the watch to the next operating mode, memory means for holding the present operating mode, a ROM for determining the next operating mode in response to the output of the switching circuit and the output of the memory means, and a test terminal for setting the output of the switching circuit to a predetermined condition and inputting the predetermined data to the ROM instead of the output of memory means.

DETAILED DESCRIPTION OF PREFERRED EMBODIMENT OF THE INVENTION

Figure 3:
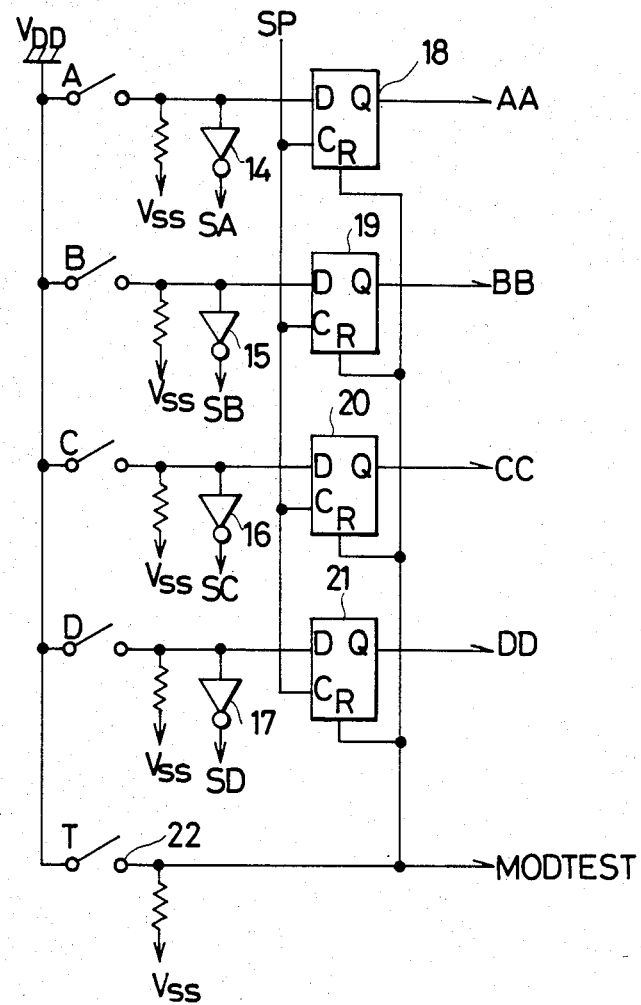
FIG. 3 shows an embodiment of an input portion of a digital watch according to the present invention.
Figure 4:
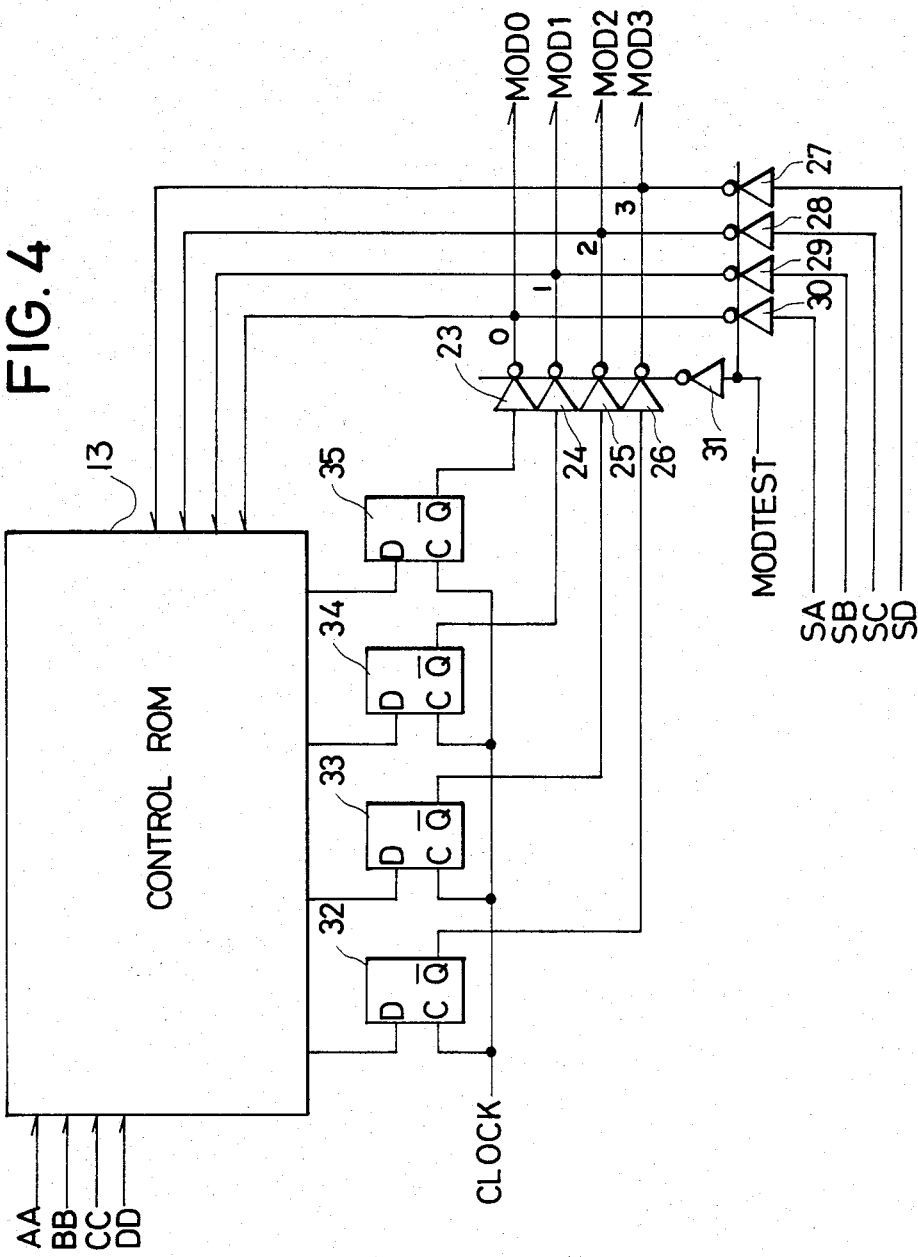
FIG. 4 shows an embodiment of a mode determining portion of a digital watch according to the present invention.

FIGS. 3 and 4 show, respectively, a switch input portion and a mode determining portion showing an embodiment of the present invention.

Figure 1:
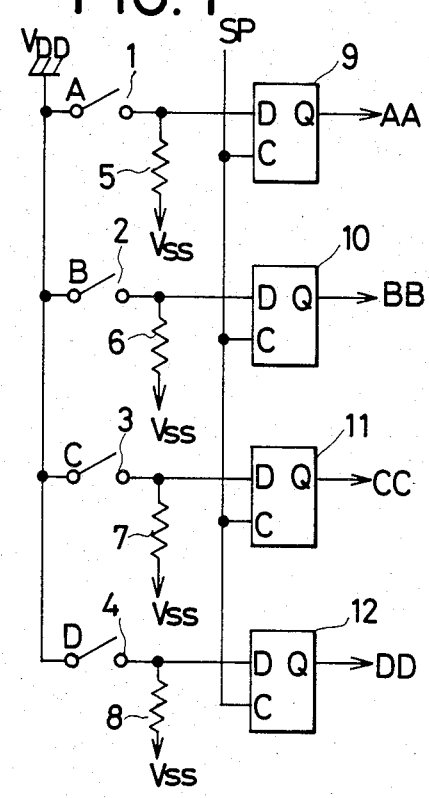
FIG. 1 shows an embodiment of a conventional input portion of a digital watch.
Figure 2:
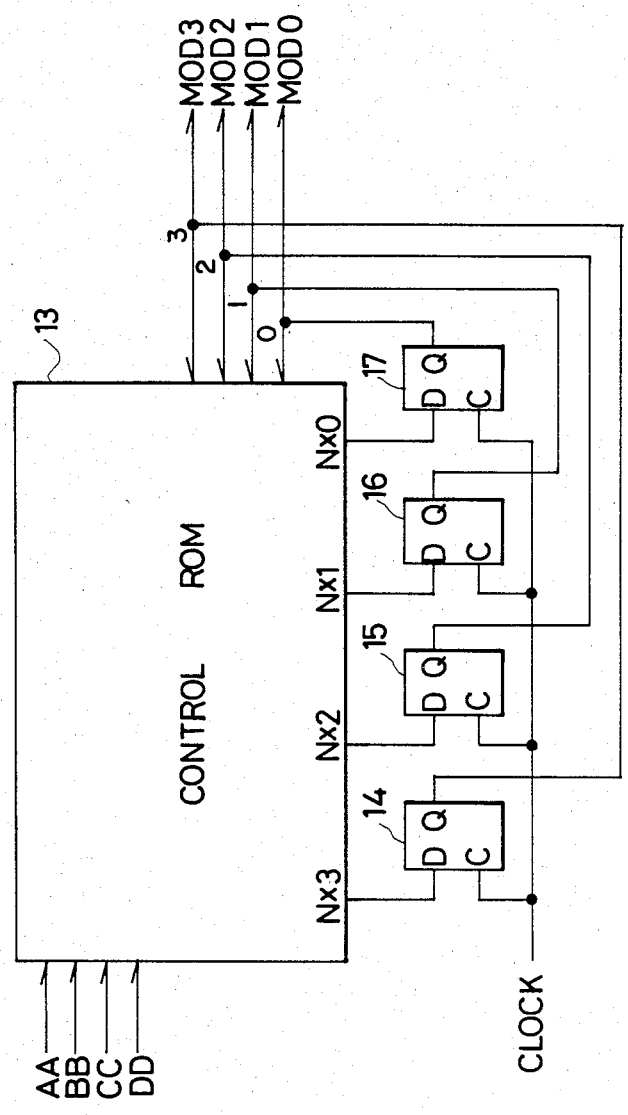
FIG. 2 shows an embodiment of a conventional mode determining portion of a digital watch.

Numerals 14-17 are inverters receptive of inverted outputs SA-SD of the switch outputs. Flipflops 18-21 comprise a first memory for storing data corresponding to the desired operating mode selected by the actuatable switches A-D, and the flipflops have reset terminals which reset the flipflops 18-21 when a test terminal 22 is "H" to drop all the outputs AA-DD to "L". Numerals 23-30 in FIG. 4 are clocked inverters which make up a multiplexer with an inverter 31. A MODTEST signal is "L" in a normal state, i.e., during non-testing, and the clocked inverters 23-26 serve as switching inverters and apply inverted signals to corresponding operating mode terminals 0-3 while, at the same time, the clocked inverters 27-30 assume a floating state and do not transmit signals to the operating mode terminals 0-3. Therefore the circuit in FIG. 4 is equivalent to the circuit in FIG. 2. The MODTEST signal is "H" during testing of the LSI, so that the clocked inverters 27-30 serve as switching inverters and the signals SA-SD are inverted and applied to the operating mode terminals 0-3 as the signals the MOD 0-MOD 3 while, at the same time, the clocked inverters 23-26 are placed in a floating state so that the outputs of a second memory comprised of flipflops 32-35 are not transmitted to the operating mode terminals. Since the signals SA-SD are the inverted signals of the switch inputs in FIG. 3, the signals applied to the switch terminals A-D are present intact at the operating mode terminals as the signals MOD 0-MOD 3. This shows that if the control ROM is programmed so that the mode may not change in case all the control ROM inputs AA-DD are "L", the value of the switch inputs are set in flipflops 32-35 at the next fall timing of the clock signal.

Figure 5:
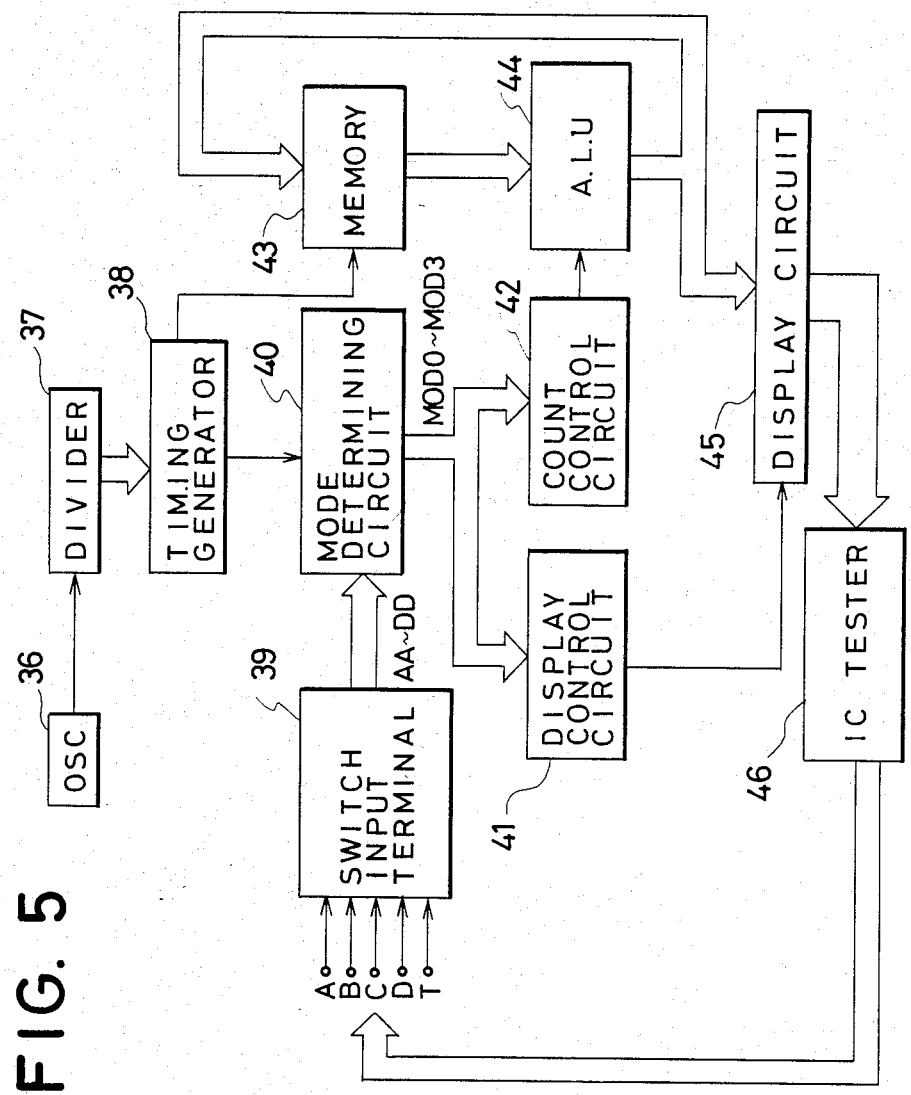
FIG. 5 is a block diagram of watch IC according to the present invention.

FIG. 5 shows an embodiment of a block diagram of a timepiece LSI according to the present invention. Outputs from an OSC 36 are divided by a divider 37. The outputs from the divider 37 are fed to a timing generator 38 for producing each timing necessary for use by the LSI. Operations of a switch input circuit 39 and a mode determining circuit 40 are the same as the operations described above in FIGS. 3 and 4. Mode signals produced from the mode determining circuit 40 are fed to a display control circuit 41 and a count control circuit 42. The display control circuit 41 controls a display circuit 45 in response to the mode signals and makes a display corresponding to the selected mode. The count control circuit 42 feeds necessary addition or subtraction signals to an A.L.U. 44 based on the switch inputs and the mode signals. The A.L.U. 44 treats each data such as time data produced in turn from a memory 43 and feeds the data back again thereto. The address of the memory 43 is cyclicly determined by the outputs from the timing generator 38. Thus the counter circuit, display circuit, etc. comprise the necessary watch structure.

In testing an IC, a test signal is fed to inputs A-D and T of the switch input circuit 39 from an IC tester 46 and simultaneously the outputs from the display circuit 45 are monitored by the IC tester 46. By applying this invention to the IC testing, the mode to be tested is directly fed to the mode determining circuit 40 from the IC tester 46, and thereby the test time can be shortened.

As illustrated, the timepiece mode can be freely changed almost momentarily to another mode in testing the LSI by use of the switch terminals, whereby it is sufficient to add only a single test terminal. Accordingly the present invention largely contributes to the speeding up of the LSI test.

What is claimed is:

1. In a test circuit for a timepiece IC having a switching circuit comprised of a plurality of switches and first memory means connected to said switches, a ROM connected to said first memory means for receiving the content thereof and connected to a plurality of operating mode terminals for receiving therefrom operating mode signals, and second memory means connected to the output terminals of said ROM for receiving therefrom data representative of operating mode signals and operative in response to an external signal applied thereto to apply operating mode signals to said operating mode terminals, the improvement comprising: a test terminal included in said switching circuit for receiving a mode test signal during use of the test circuit; first switching means connected between said second memory means and said operating mode terminals, the first switching means being opened when a mode test signal is applied to said test terminal and being closed in the absence of a mode test signal being applied to said test terminal; and second switching means connected between the output terminals of said switches and said operating mode terminals, the second switching means being closed when a mode test signal is applied to said test terminal and being opened in the absence of a mode test signal being applied to said test terminal; whereby mode operating signals are produced at said operating mode terminals corresponding to the switching states of said switches when a mode test signal appears on said test terminal.

2. A test circuit according to claim 1; wherein said first memory means and said second memory means each comprises a plurality of flipflops.

3. A test circuit according to claim 2; wherein said first switching means and said second switching means each comprises a plurality of clocked inverters.

4. A test circuit according to claim 1; wherein said first switching means and said second switching means each comprises a plurality of clocked inverters.

5. In a test circuit for selectively testing the operating modes of a timepiece integrated circuit of the type which is operable in a plurality of different operating modes according to the selective actuation of a plurality of actuatable switches to produce corresponding operation mode signals at a plurality of operating mode terminals: first memory means for storing data corresponding to a desired operating mode selected by the actuation of the plurality of switches and for applying the stored data to the timepiece integrated circuit of the plurality of switches; second memory means for storing data corresponding to the present operating mode in which the timepiece integrated circuit is operating; a test terminal; means for applying a mode test signal to the test terminal when it is desired to test an operating mode of the timepiece integrated circuit; first switching means operative in the absence of a mode test signal being applied to the test terminal for switching the stored data from the second memory means to the operating mode terminal and operative in response to the mode test signal being applied to the test terminal for preventing the switching of the stored data from the second memory means to the operating mode terminals; and second switching means operative in response to a mode test signal being applied to the test terminal for switching data corresponding to a desired operating mode selected by the actuation of the plurality of switches to the operating mode terminals and operative in the absence of a mode test signal being applied to the test terminal for preventing said switching of data to the operating mode terminals.

6. A test circuit according to claim 5; wherein said first memory means and said second memory means each comprises a plurality of flipflops.

7. A test circuit according to claim 6; wherein said first switching means and said second switching means each comprises a plurality of clocked inverters.

8. A test circuit according to claim 5; wherein said first switching means and said second switching means each comprises a plurality of clocked inverters.

9. A test circuit according to claim 5; wherein the timepiece integrated circuit has a first group of input terminals connected to receive the stored data from the first memory means and a second group of input terminals connected to receive the operating mode signals appearing on the operating mode terminals, and a group of output terminals connected to apply data corresponding to the present operating mode to the second memory means.

10. A test circuit according to claim 9; wherein the timepiece integrated circuit comprises a ROM integrated circuit.

11. A test circuit according to claim 5; wherein the first memory means comprises a plurality of flipflops equal in number to the number of actuatable switches, each flipflop having an input terminal connected to an output terminal of a respective one of the actuatable switches, and a reset terminal connected to the test terminal whereby application of a mode test signal to the test terminal effects resetting of the plurality of flipflops.

12. A test circuit according to claim 11; wherein said first memory means and said second memory means each comprises a plurality of flipflops.

13. A test circuit according to claim 12; wherein said first switching means and said second switching means each comprises a plurality of clocked inverters.

14. A test circuit according to claim 5; wherein the first memory means has an enabled state in which the data stored therein can be applied to the timpiece integrated circuit and a disenabled state in which the stored data cannot be applied to the timepiece integrated circuit, and means for placing the first memory means in the disenabled state in response to a mode test signal appearing on the test terminal.

* * * * *